(12) United States Patent
Dyer et al.

(10) Patent No.: US 7,456,450 B2
(45) Date of Patent: Nov. 25, 2008

(54) CMOS DEVICES WITH HYBRID CHANNEL ORIENTATIONS AND METHOD FOR FABRICATING THE SAME

(75) Inventors: Thomas W. Dyer, Pleasant Valley, NY (US); Xiangdong Chen, Poughquag, NY (US); James J. Toomey, Poughkeepsie, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 11/307,481

(22) Filed: Feb. 9, 2006

(65) Prior Publication Data

US 2007/0181980 A1    Aug. 9, 2007

(51) Int. Cl.
*H01L 29/04* (2006.01)
(52) U.S. Cl. .................. 257/255; 257/627; 257/369; 257/330; 257/331; 257/338; 257/521; 257/527; 257/E29.004
(58) Field of Classification Search .......... 257/E29.169, 257/E31.085, 213, 289, 255, 627, E29.242, 257/E21.051, E21.4, E29.221, 327, 410, 257/347, 369, 204, 330, 331, 338, 350, E21.632, 257/521, 527, 628, E29.004; 438/198
See application file for complete search history.

(56) References Cited

U.S. PATENT DOCUMENTS 3,986,200 A * 10/1976 Allison ........................ 257/521

| 4,455,740 | A | | 6/1984 | Iwai | |
|---|---|---|---|---|---|
| 4,939,100 | A | * | 7/1990 | Jeuch et al. | 438/297 |
| 5,808,340 | A | * | 9/1998 | Wollesen et al. | 257/330 |
| 5,905,283 | A | | 5/1999 | Kasai | |
| 6,075,270 | A | * | 6/2000 | Okihara et al. | 257/330 |
| 2002/0185676 | A1 | * | 12/2002 | Momose | 257/327 |
| 2003/0190791 | A1 | | 10/2003 | Fischetti et al. | |
| 2004/0119124 | A1 | * | 6/2004 | Omi et al. | 257/410 |
| 2006/0108635 | A1 | * | 5/2006 | Bhalla et al. | 257/329 |

* cited by examiner

*Primary Examiner*—Matthew C. Landau
*Assistant Examiner*—Jay C Kim
(74) *Attorney, Agent, or Firm*—Scully, Scott, Murphy & Presser, P.C.; H. Daniel Schnurmann (57) ABSTRACT

The present invention relates to a semiconductor substrate comprising at least first and second device regions, wherein the first device region comprises a first recess having interior surfaces oriented along a first set of equivalent crystal planes, and wherein the second device region comprises a second recess having interior surfaces oriented along a second, different set of equivalent crystal planes. A semiconductor device structure can be formed using such a semiconductor substrate. Specifically, at least one n-channel field effect transistor (n-FET) can be formed at the first device region, which comprises a channel that extends along the interior surfaces of the first recess. At least one p-channel field effect transistor (p-FET) can be formed at the second device region, which comprises a channel that extends along the interior surfaces of the second recess.

8 Claims, 7 Drawing Sheets

CMOS DEVICES WITH HYBRID CHANNEL ORIENTATIONS AND METHOD FOR FABRICATING THE SAME

FIELD OF THE INVENTION

The present invention relates to semiconductor devices that can be used in complementary metal-oxide-semiconductor (CMOS) circuits. More specifically, the present invention relates to a CMOS circuit that comprises at least one n-channel field effect transistor (n-FET) and at least one p-channel field effect transistor (p-FET) with hybrid channel orientations. In other words, the n-FET and p-FET of the CMOS circuit comprise channels that are oriented along different sets of crystal planes of the semiconductor substrate on which the CMOS circuit is located.

BACKGROUND OF THE INVENTION

In present semiconductor technology, CMOS devices, such as n-FETs and p-FETs, are typically fabricated upon semiconductor wafers that each has a substrate surface oriented along one of a single set of equivalent crystal planes of the semiconductor material (e.g., Si) that forms the substrate. In particular, most of today's semiconductor devices are built upon silicon wafers having wafer surfaces oriented along one of the {100} crystal planes of silicon.

Electrons are known to have a high mobility along the {100} crystal planes of silicon, but holes are known to have high mobility along the {110} crystal planes of silicon. Specifically, hole mobility values along the {100} planes are roughly about 2 to 4 times lower than the corresponding electron mobility values along such planes. On the other hand, hole mobility values along the {110} silicon surfaces are about 2 times higher than those along the {100} silicon surfaces, but electron mobility along the {110} surfaces are significantly degraded compared to those along the {100} surfaces.

As can be deduced from the above, the {110} silicon surfaces are optimal for forming p-FET devices due to the excellent hole mobility along the {110} planes, which leads to higher drive currents in the p-FETs. However, such surfaces are completely inappropriate for forming n-FET devices. The {100} silicon surfaces instead are optimal for forming n-FET devices due to the enhanced electron mobility along the {100} planes, which results in higher drive currents in the n-FETs.

In view of the above, there is a need for providing a semiconductor substrate having different surface orientations (i.e., hybrid surface orientations) that provide optimal performance for a specific device.

A need also exists to provide a method to form an integrated semiconductor device formed on a substrate with hybrid surface orientations, while the integrated semiconductor device comprises at least an n-FET and a p-FET having hybrid channel orientations, i.e., the n-FET channel is oriented along a first set of equivalent crystal planes that provide relatively higher electron mobility, and the p-FET channel is oriented along a second, different set of equivalent crystal planes that provide relatively higher hole mobility.

SUMMARY OF THE INVENTION

The present invention provides a semiconductor substrate with hybrid surface orientations. The semiconductor substrate of the present invention may either comprise a bulk semiconductor structure or a layered semiconductor-on-insulator (SOI) structure, which can be processed by etching steps to form recesses with interior surfaces that are oriented along different sets of crystal planes of the semiconductor substrate material. Such a semiconductor substrate can be readily used to form CMOS circuits that comprise n-FETs and p-FETs with different channel orientations.

In one aspect, the present invention relates to a semiconductor device comprising:

a semiconductor substrate comprising at least first and second device regions, wherein the first device region comprises a first recess having interior surfaces oriented along a first set of equivalent crystal planes, and wherein the second device region comprises a second recess having interior surfaces oriented along a second, different set of equivalent crystal planes;

at least one n-channel field effect transistor (n-FET) located at the first device region, the n-FET comprising a channel that extends along the interior surfaces of the first recess; and at least one p-channel field effect transistor (p-FET) located at the second device region, the p-FET comprising a channel that extends along the interior surfaces of the second recess.

The term "equivalent crystal planes" as used in the present invention refers to a family of equivalent crystal planes or facets as defined by the Miller Indexes, which will be described in greater detail hereinafter.

In another aspect, the present invention relates to a method for forming a semiconductor device, comprising:

forming a semiconductor substrate that comprises at least first and second device regions;

forming a first recess at the first device region and a second recess in the second device region of the semiconductor substrate, wherein the first recess has interior surfaces oriented along a first set of equivalent crystal planes, and wherein the second recess has interior surfaces oriented along the second, different set of equivalent crystal planes; and forming at least one n-FET at the first device region and at least one p-FET at the second device region, wherein the n-FET comprises a channel that extends along the interior surfaces of the first recess, and wherein the p-FET comprises a channel that extends along the interior surfaces of the second recess.

In a further aspect, the present invention relates to a semiconductor substrate comprising at least first and second device regions, wherein the first device region comprises a first recess having interior surfaces oriented along a first set of equivalent crystal planes, and wherein the second device region comprises a second recess having interior surfaces oriented along a second, different set of equivalent crystal planes.

In a still further aspect, the present invention relates to a method comprising:

forming a semiconductor substrate that comprises at least first and second device regions; and forming a first recess at the first device region and a second recess in the second device region of the semiconductor substrate, wherein the first recess has interior surfaces oriented along a first set of equivalent crystal planes, and wherein the second recess has interior surfaces oriented along the second, different set of equivalent crystal planes.

Other aspects, features and advantages of the invention will be more fully apparent from the ensuing disclosure and appended claims.

DETAILED DESCRIPTION OF THE INVENTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention provides hybrid semiconductor substrates that contain multiple recesses with interior surfaces that are oriented along different sets of crystal planes of the semiconductor substrate material. More specifically, a first recess (or a first set of recesses) has (or have) interior surfaces oriented along a first set of equivalent crystal planes, in which the mobility of a specific type of charge carriers (i.e., holes or electrons) is enhanced. A second recess (or a second set of recesses) has (or have) interior surfaces oriented along a second, different set of equivalent crystal planes, in which the mobility of a different type of charge carriers (i.e., electrons or holes) is enhanced.

The hybrid semiconductor substrate of the present invention may comprise any single crystal semiconductor material, which includes, but is not limited to: Si, SiC, SiGe, SiGeC, Ge alloys, GaAs, InAs, InP, as well as other III-V or II-VI compound semiconductors.

Figure 1:
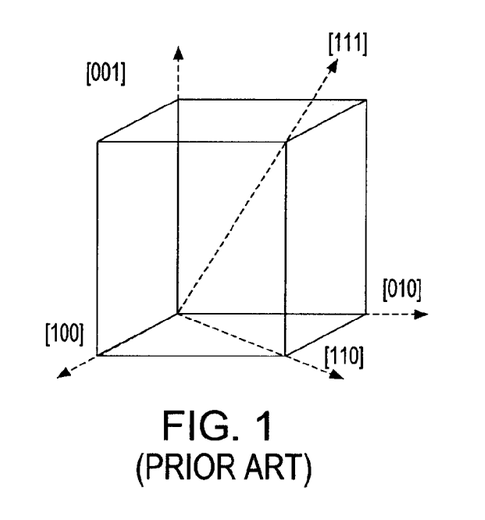
FIG. 1 shows a silicon crystal unit cell with certain crystal orientations specifically indicated by arrowheads.
Figure 2:
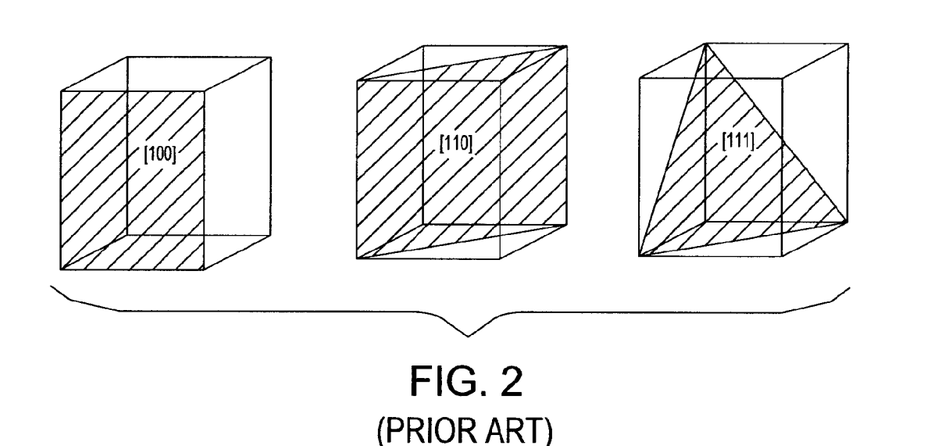
FIG. 2 shows certain specific crystal planes in silicon crystal unit cells.

In single crystal semiconductor materials, all lattice directions and lattice planes in a unit cell of a single crystal material can be described by a mathematical description known as a Miller Index. Specifically, the notation [hkl] in the Miller Index defines a crystal direction or orientation. FIG. 1 shows a single crystal silicon unit cell, which is a cubic cell. Certain crystal directions, such as [001], [100], [010], [110], and [111], are specifically indicated by arrowheads in the cubic unit cell. On the other hand, the crystal planes or facets of a single crystal silicon unit cell are defined by the notation (hkl) in Miller Index, which refers to a particular crystal plane or facet that is perpendicular to the [hkl] direction. FIG. 2 illustratively shows the crystal planes (100), (110), and (111) of the single crystal silicon unit cells, which are respectively perpendicular to the [100], [110], and [111] directions.

Further, because the unit cells are periodic in a semiconductor crystal, there exist families or sets of equivalent crystal directions and planes. The notation <hkl> in the Miller Index therefore defines a family or set of equivalent crystal directions or orientations. For example, the <100> directions include the equivalent crystal directions of [100], [010], and [001]; the <110> directions include the equivalent crystal directions of [110], [011], [101], [−1−10], [0−1−1], [−10−1], [−110], [0−11], [−101], [1−10], [01−1], and [10−1]; and the <111> directions include the equivalent crystal directions of [111], [−111], [1−11], and [11−1]. Similarly, the notation {hkl} defines a family or set of equivalent crystal planes or facets that are respectively perpendicular to the <hkl> directions. For example, the {100} planes include the set of equivalent crystal planes that are respectively perpendicular to the <100> directions.

In a particularly preferred (but not necessary) embodiment of the present invention, the hybrid semiconductor substrate comprises single crystal silicon. The first recess or the first set of recesses therefore may have interior surfaces oriented along the {100} planes of silicon, while the second recess or the second set of recesses may have interior surfaces oriented along the {110} planes of silicon. In this manner, the hybrid semiconductor substrate of the present invention can be used for fabricating a CMOS circuit, which comprises one or more n-FETs with channel(s) oriented along the interior surfaces of the first recess or the first set of recesses and one or more p-FETs with channel(s) oriented along the interior surfaces of the second recess or the second set of recesses.

Alternatively, the first recess or the first set of recesses may have interior surfaces oriented along the {100} planes of silicon, while the second recess or the second set of recesses may have interior surfaces oriented along the {111} planes of silicon. Further, the first recess or the first set of recesses may have interior surfaces oriented along the {111} planes of silicon, while the second recess or the second set of recesses may have interior surfaces oriented along the {110} planes of silicon. Any other suitable combination of surface orientations can also be provided for the recesses in the hybrid semiconductor substrate for achieving enhanced device performance.

Figure 3:
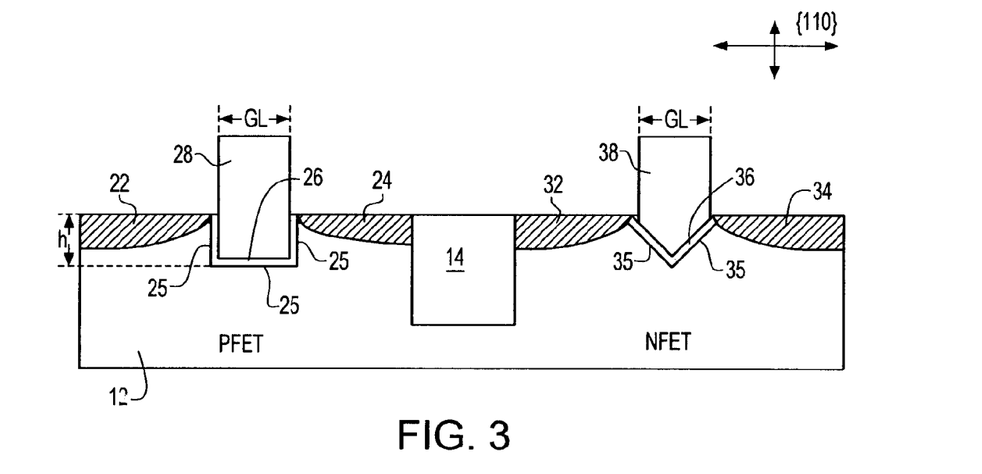
FIG. 3 is a cross-sectional view of a CMOS circuit fabricated on a semiconductor substrate having a substrate surface oriented along one of the {110} planes of silicon, while the CMOS circuit contains at least one p-FET with its channel oriented along the {110} planes of silicon and at least one n-FET with its channel oriented along the {100} planes of silicon, according to one embodiment of the present invention.

FIG. 3 specifically shows a cross-sectional view of a CMOS circuit fabricated on a semiconductor substrate 12, according to one embodiment of the present invention. The semiconductor substrate 12 has a substrate surface that is oriented along one of the {110} planes and comprises at least one p-FET device region (on the left) and at least one n-FET device region (on the right), which are separated from each other by a trench isolation region 14.

The semiconductor substrate 12 as described hereinabove may comprise any single crystal semiconductor material, which includes, but is not limited to: Si, SiC, SiGe, SiGeC, Ge alloys, GaAs, InAs, InP, as well as other III-V or II-VI compound semiconductors. Preferably, such a hybrid semiconductor substrate is composed of a Si-containing semiconductor material, i.e., a semiconductor material that includes silicon. For example, the hybrid semiconductor substrate may consist essentially of bulk single crystal silicon. Alternatively, the hybrid semiconductor substrate may comprise a SOI structure that contains a thin single crystal silicon layer located over a buried insulator layer, which functions to reduce the leakage current in the substrate. The hybrid semiconductor substrate may be doped, undoped or contain both doped and undoped regions therein. For example, the semiconductor substrate may also include a first doped (n- or p-) region and a second doped (p- or n-) region. The first doped region and the second doped region may be the same, or they may have different conductivities and/or doping concentrations. These doped regions are known as "wells" and can be used to define various device regions.

At least one isolation region, such as, for example, the trench isolation region 14, can be provided in the semiconductor substrate 12 to isolate the p-FET device region from the n-FET device region. The isolation region may be a trench isolation region (as shown) or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process.

A first recess, which is defined by interior surfaces 25, is located in the p-FET device region. The interior surfaces 25 of this first recess are oriented along the {110} crystal planes, as illustrated by the arrowheads in the upper right hand corner of FIG. 3. The p-FET device region of the semiconductor substrate 12 contains a p-FET device, which comprises source and drain 22 and 24 located at opposite sides of the first recess, a channel that is located between the source and drain 22 and 24 and is oriented along the interior surfaces 25 of the first recess. The p-FET device further comprises a gate stack that includes a gate dielectric 26 formed over the interior surfaces 25 of the first recess and a gate electrode 28 located on top of the gate dielectric 26.

A second recess, which is defined by interior surfaces 35, is located in the n-FET device region. The interior surfaces 35 of this second recess are oriented along the {100} crystal planes, which are tilted at 45° angles in relation to the {110} crystal planes. The n-FET device region of the semiconductor substrate 12 contains an n-FET device, which comprises source and drain 32 and 34 located at opposite sides of the second recess, a channel that is located between the source and drain 32 and 34 and is oriented along the interior surfaces 35 of the second recess. The n-FET device further comprises a gate stack that includes a gate dielectric 36 formed over the interior surfaces 35 of the second recess and a gate electrode 38 located on top of the gate dielectric 36.

In this manner, the channel of the p-FET device is oriented along the {110} planes with enhanced hole mobility, while the channel of the n-FET device is oriented along the {100} planes with enhanced electron mobility.

Another important advantage of the present invention is that channel lengths of both the p-FET and n-FET devices are longer than their respective gate lengths. Specifically, the p-FET channel length is approximately equal to the sum of the gate length GL and twice the height of the first recess h (i.e., $\approx GL+2h$). Moreover, the n-FET channel length is approximately equal to 2.8 times of the gate length GL (i.e., $\approx 2 \times 2^{1/2}$ GL).

As the CMOS technology is scaled down, it is very difficult to scale the channel length in convention planar metal-oxide-semiconductor field effect transistors (MOSFETs), due to the severe short channel effect in devices with channel lengths below 30 nm. However, scaling the MOSFET size is important for increasing the circuit density, reducing the manufacturing costs, and improving the device performance. The present invention, by proposing a MOSFET structure with a channel length longer than the gate length, therefore allows further scaling of the MOSFET size (which is defined by the gate length) without reducing the channel length.

Figure 4:
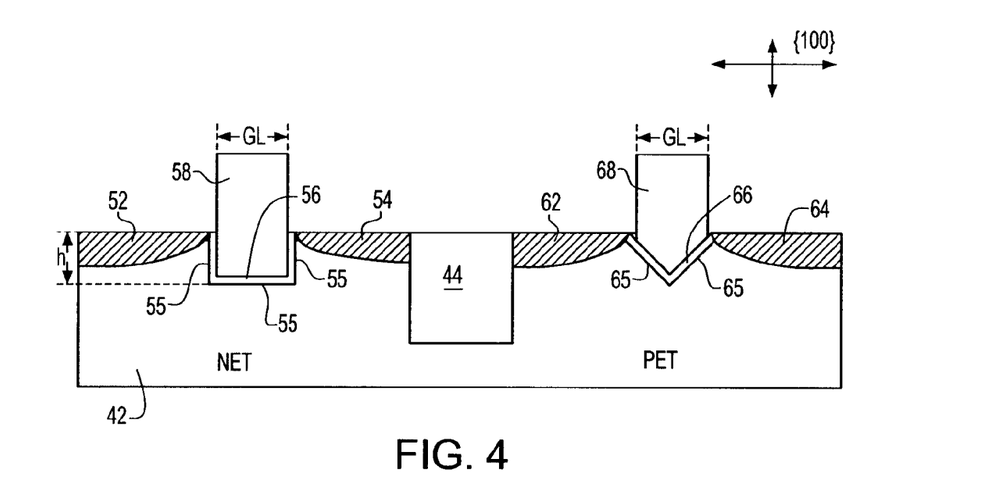
FIG. 4 is a cross-sectional view of a CMOS circuit fabricated on a semiconductor substrate having a substrate surface oriented along one of the {100} planes of silicon, while the CMOS circuit contains at least one n-FET with its channel oriented along the {100} planes of silicon and at least one p-FET with its channel oriented along the {110} planes of silicon, according to one embodiment of the present invention.

FIG. 4 shows a cross-sectional view of a CMOS circuit fabricated on a semiconductor substrate 42, according to another embodiment of the present invention, which is similar, to but slightly different from, the embodiment illustrated by FIG. 3.

The semiconductor substrate 42 has a substrate surface that is oriented along one of the {100} planes, instead of the {110} planes as shown in FIG. 3. The substrate 42 comprises at least one n-FET device region (on the left) and at least one p-FET device region (on the right) separated from each other by a trench isolation region 44.

A first recess, which is defined by interior surfaces 55, is located in the n-FET device region. The interior surfaces 55 of this first recess are oriented along the {100} crystal planes, as illustrated by the arrowheads in the upper right hand corner of FIG. 4. The n-FET device region of the semiconductor substrate 42 contains an n-FET device, which comprises source and drain 52 and 54 located at opposite sides of the first recess, a channel that is located between the source and drain 52 and 54 and is oriented along the interior surfaces 55 of the first recess. The n-FET device further comprises a gate stack that includes a gate dielectric 56 formed over the interior surfaces 55 of the first recess and a gate electrode 58 located on top of the gate dielectric 56.

A second recess, which is defined by interior surfaces 65, is located in the p-FET device region. The interior surfaces 65 of this second recess are oriented along the {110} crystal planes, which are tilted at 45° angles in relation to the {100} crystal planes. The p-FET device region of the semiconductor substrate 42 contains a p-FET device, which comprises source and drain 62 and 64 located at opposite sides of the second recess, a channel that is located between the source and drain 62 and 64 and is oriented along the interior surfaces 65 of the second recess. The p-FET device further comprises a gate stack that includes a gate dielectric 66 formed over the interior surfaces 65 of the second recess and a gate electrode 68 located on top of the gate dielectric 66.

In this manner, the channel of the n-FET device is oriented along the {100} planes with enhanced electron mobility, while the channel of the p-FET device is oriented along the {110} planes with enhanced hole mobility. Further, the n-FET channel length is approximately equal to the sum of the gate length GL and twice the height of the first recess h (i.e., $\approx GL+2h$). Moreover, the p-FET channel length is approximately equal to 2.8 times of the gate length GL (i.e., $\approx 2 \times 2^{1/2}$ GL).

The embodiments as illustrated by FIGS. 3 and 4 differ in the surface orientations of the semiconductor substrates 12 and 42. When the substrate surface orientation is aligned with one of the set of equivalent crystal planes that provide relatively enhanced hole mobility, as illustrated by FIG. 3, the recess at the p-FET device region will have a substantially rectangular cross-section with interior surfaces oriented either parallel to, or perpendicular to, the substrate surface, while the recess at the n-FET device region will have a substantially triangular cross-section with interior surfaces tilted at certain angles in relation to the substrate surface. In contrast, when the substrate surface orientation is aligned with one of the set of equivalent crystal planes that provide relatively enhanced electron mobility, as illustrated by FIG. 4, the recess at the n-FET device region will instead have a substantially rectangular cross-section with interior surfaces oriented either parallel to, or perpendicular to, the substrate surface, while the recess at the p-FET device region will have a substantially triangular cross-section with interior surfaces tilted at certain angles in relation to the substrate surface.

Note that while FIGS. 3-4 illustratively demonstrate exemplary CMOS device structures according to specific embodiments of the present invention, it is clear that a person ordinarily skilled in the art can readily modify such device structures for adaptation to specific application requirements, consistent with the above descriptions. For example, while the semiconductor substrates shown in FIGS. 3-4 represent bulk semiconductor substrates, it should be appreciated that semiconductor-on-insulator (SOI) substrates can also be used for practice of the present application. Further, while the {110} and {100} crystal planes of single crystal silicon are primarily illustrated by FIGS. 3-4 for defining the channel orientations of the p-FET and the n-FET devices, other suitable crystal planes, such as the {111}, {211}, {311}, {511}, and {711} planes of single crystal silicon, can also be used in any suitable combination for defining the channel orientations of the p-FET and n-FET devices. Moreover, other single crystal semiconductor substrate materials with non-cubic unit cells, such as single crystal gallium nitride having hexagonal unit cells, can also be used for fabricating the CMOS devices of the present invention, as long as such other single crystal semiconductor materials contain different sets of crystal planes that have different carrier mobility values. A person ordinarily skilled in the art can readily modify the device structures illustrated in FIGS. 3 and 4 for adaptation to other substrate structures, crystal orientations, or semiconductor materials, consistent with the spirit and principles of the present invention.

The hybrid crystal orientation substrate of the present invention can be readily formed by selective etching steps.

Specifically, a semiconductor substrate is first provided, which may have a substrate surface that is oriented along one of a specific set of equivalent crystal planes (e.g., the {100}, {110}, or {111} planes) is provided. Such a semiconductor substrate, as described hereinabove, may comprise any single crystal semiconductor material, which includes, but is not limited to: Si, SiC, SiGe, SiGeC, Ge alloys, GaAs, InAs, InP, as well as other III-V or II-VI compound semiconductors.

A first selected region on the substrate surface is then selectively etched to form a first recess that has interior surfaces oriented along a first set of equivalent crystal planes, which can be the same set of equivalent crystal planes that the substrate surface is aligned to (i.e., the substrate surface planes), or it can be a different set of equivalent crystal planes that are tilted at an angle with respect to the substrate surface planes. If the first set of equivalent crystal planes needs to be the same set of equivalent crystal planes as the substrate surface planes, then the first recess can be formed by an anisotropic etching process that etches the semiconductor substrate along a direction that is perpendicular to the substrate surface (i.e., straight into the substrate). Alternatively, if the first set of equivalent crystal planes needs to be different from the substrate surface planes, the first recess can be formed by a crystallographic etching process that etches the semiconductor substrate along all directions, but along the substrate surface planes at a rate faster than that along the first set of equivalent crystal planes.

Subsequently, a second selected region on the substrate surface is selectively etched to form a second recess that has interior surfaces oriented along a second, different set of equivalent crystal planes. If the second, different set of equivalent crystal planes is to be the same set of equivalent crystal planes as the substrate surface planes, then the second recess can be formed by an anisotropic etching process along a direction that is perpendicular to the substrate surface (i.e., straight into the substrate). Alternatively, if the second, different set of equivalent crystal planes needs to be different from the substrate surface planes, the second recess can be formed by a crystallographic etching process that etches the semiconductor substrate along all directions, but along the substrate surface planes at a rate faster than that along the second, different set of equivalent crystal planes.

The anisotropic and crystallographic etching processes as mentioned hereinabove can be carried out by any suitable dry and/or wet etching techniques known in the art.

Preferably, but not necessarily, the anisotropic etching of the semiconductor substrate can be carried out by one or more dry-etching processes, such as reactive ion etching, sputter etching, vapor phase etching, ion beam etching, plasma etching, and laser ablation. The dry-etching processes are directional, but they are mostly non-selective to different crystal planes or orientations, i.e., they etch the semiconductor substrate in approximately equal rates along all directions. In a particularly preferred embodiment of the present invention, the dry-etching is carried out using a reactive ion etching (RIE) process.

Crystallographic etching of the semiconductor substrate is preferably carried out by one or more wet-etching processes, which employ etching solutions such as hydroxide-based etching solutions, ethylene diamine pyrocatechol (EDP)-based etching solutions, etc. These wet-etching processes typically etch the semiconductor substrate along all directions, but with a crystallographic selectivity, i.e., at significantly different etching rates along different crystal planes or orientations (which are referred to herein as "crystallographic etching"). Therefore, the etch pattern formed by a crystallographic etching process proceeds along the fast-etched crystal planes and is eventually terminated by the slowly-etched crystal planes.

For example, an etching solution that comprises approximately 23.4% KOH, 13.3% isopropyl alcohol (IPA), and 63.3% water, when heated to about 80° C., etches the single crystal silicon at an etching rate of about 1.0 µm/minute along the {100} planes, but at an etching rate of about 0.06 µm/minute along the {110} planes. In other words, this etching solution etches the {100} planes about 17 times faster than the {110} planes. Therefore, such an etching solution can be used to etch a silicon substrate to form a recess that is terminated at the {110} planes.

In contrast, an etching solution that comprises approximately 44% KOH and 56% water, when heated to about 120° C., etches the single crystal silicon at an etching rate of about 11.7 µm/minute along the {110} planes, about 5.8 µm/minute along the {100} planes, and about 0.02 µm/minute along the {111} planes. In other words, this etching solution etches the {110} and {100} planes significantly faster than the {111} planes (more than 550 and 250 times faster, respectively). Therefore, such an etching solution can be used to etch a silicon substrate to form a recess that is terminated at the {111} planes.

Note that although dry-etching is typically used for anisotropic etching, certain dry-etching techniques, such as RIE, can also be used for crystallographic etching. In RIE, the substrate is placed inside a reactor in which several gases are introduced. A plasma is introduced in the gas mixture using an radio-frequency (RF) power source, breaking the gas molecules into ions. The ions are accelerated towards, and react at, the surface of the material being etched, forming another gaseous material. This is known as the chemical part of reactive ion etching, which can be crystallographic, i.e., with crystallographic selectivity along different crystal planes or directions. The RIE also has a physical aspect: if the ions have high enough energy, the ions can knock atoms out of the material to be etched without a chemical reaction. The physical etching aspect of RIE is highly anisotropic, but without crystallographic selectivity. Therefore, RIE is a complex process that involves both chemical and physical etching. By carefully adjusting the chemistry and the balance between the chemical aspect and the physical aspect of RIE, this process can be used to achieve either anisotropic or crystallographic etching results. Similarly, although wet-etching is typically used for crystallographic etching, certain wet-etching chemistries can also be used to achieve anisotropic etching results.

Therefore, the present invention is not limited to the use of dry-etching for the anisotropic etching process and the use of wet-etching for the crystallographic etching process, but encompasses all suitable etching processes and techniques that can be used to achieved the desired anisotropic and crystallographic results as described hereinabove.

After formation of the first and second recesses in the semiconductor substrate, additional CMOS processing steps can then be carried out to form an n-FET and p-FET at the first and second device regions. The n-FET and p-FET are arranged and constructed in such a manner that the channels of the n-FET and p-FET extend along the interior surfaces of the first and second recesses, which are respectively oriented along equivalent crystal planes that enhance the mobility of the respective carriers in the n-FET channel and the p-FET channel.

FIGS. 5A-5M illustrate the exemplary processing steps for forming a CMOS circuit that contains a p-FET and an n-FET with hybrid channel orientations, according to one embodiment of the present invention.

Figure 5A:
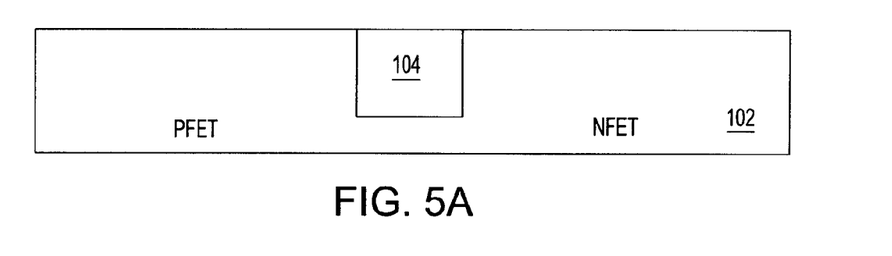
FIGS. 5A-5M illustrate exemplary processing steps used for fabricating a CMOS circuit that contains a p-FET and an n-FET with hybrid channel orientations, according to one embodiment of the present invention.

Reference is first made to FIG. 5A, which shows a semiconductor substrate 102 that has a substrate surface aligned with one of the {110} crystal planes of silicon. The semiconductor substrate comprises a p-FET device region (at the left side) and an n-FET device region (at the right side), which are separated from each other by a trench isolation region 104.

A gate dielectric layer 106 is formed over the substrate 102. The gate dielectric layer 106 can be formed by a thermal growing process such as, for example, oxidation, nitridation or oxynitridation. Alternatively, the gate dielectric layer 106 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric layer 106 may also be formed utilizing any combination of the above processes.

The gate dielectric layer 106 is comprised of an insulating material including, but not limited to: an oxide, nitride, oxynitride and/or silicate including metal silicates and nitrided metal silicates. In one embodiment, it is preferred that the gate dielectric layer 106 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof.

The physical thickness of the gate dielectric layer 106 may vary, but typically, the gate dielectric layer 106 has a thickness from about 0.5 to about 10 nm, with a thickness from about 1 to about 5 nm being more typical.

Figure 5B:
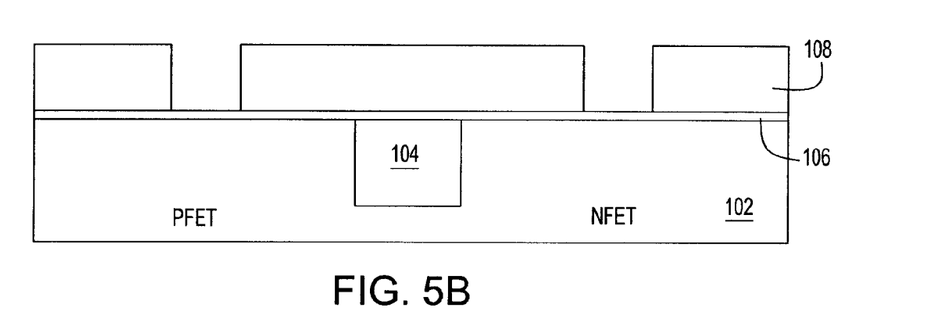

After forming the gate dielectric layer 106, a blanket dielectric hard mask layer 108 is deposited over the gate dielectric layer 106, followed by patterning of the blanket dielectric hard mask layer 108 to form at least two etch openings, one at the n-FET device region and one at the p-FET device region, as shown in FIG. 5B. The dielectric hard mask layer 108 may comprise an oxide, nitride, oxynitride or any combination thereof, and it can be deposited utilizing a deposition process such as, for example, physical vapor deposition or chemical vapor deposition. Preferably, but not necessarily, the dielectric hard mask layer 108 comprises a nitride and has a thickness ranging from about 50 nm to about 150 nm, and more preferably from about 80 nm to about 120 nm.

The blanket dielectric hard mask layer 108 may be patterned by lithography and etching. The lithography step, preferably defining the gate level, includes applying a photoresist (not shown) to the upper surface of the blanket dielectric hard mask layer 108, exposing the photoresist to a desired pattern of radiation and developing the exposed photoresist utilizing a conventional resist developer. The pattern in the photoresist is then transferred to the dielectric mask layer 108 utilizing one or more dry etching steps to form the etch openings. Suitable dry etching processes that can be used in the present invention in patterning the dielectric hard mask layer 108 include, but are not limited to: reactive ion etching (RIE), ion beam etching, plasma etching or laser ablation. Preferably, the etching is carried out by a nitride RIE step that stops on the gate dielectric layer 106. The patterned photoresist is then removed by resist stripping after etching has been completed.

Figure 5C:
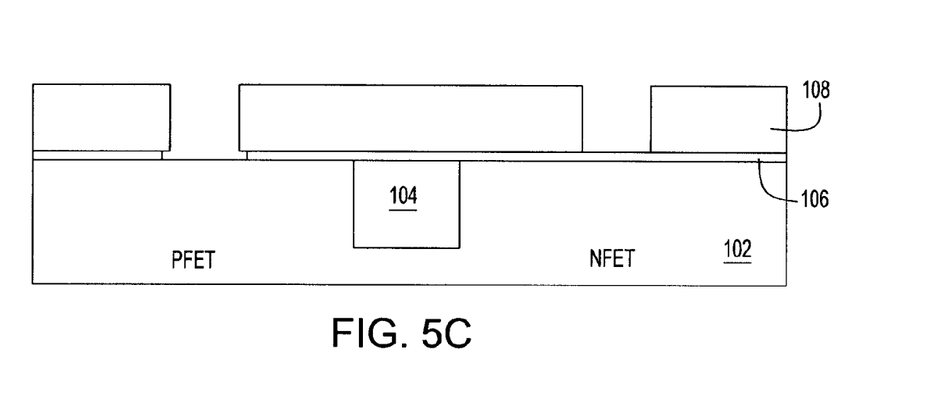

Next, a block mask (not shown) is selectively formed over the n-FET device region, but not the p-FET device region, followed by selective etching of the gate dielectric layer 106 in the p-FET device region, as shown in FIG. 5C. The selective etching of the gate dielectric layer 106 can be carried out by any suitable etching process that etches the gate dielectric material in layer 106 in selection to the semiconductor material in the underlying substrate 102 and the masking material in the dielectric hard mask layer 108. Preferably, and when the gate dielectric layer 106 comprises an oxide and the dielectric hard mask layer 108 comprises a nitride, a hydrofluoric acid-based etching solution is used; this etchant etches oxides at a rate much faster than semiconductor materials, such as silicon, and its does not etch nitride at all.

Figure 5D:
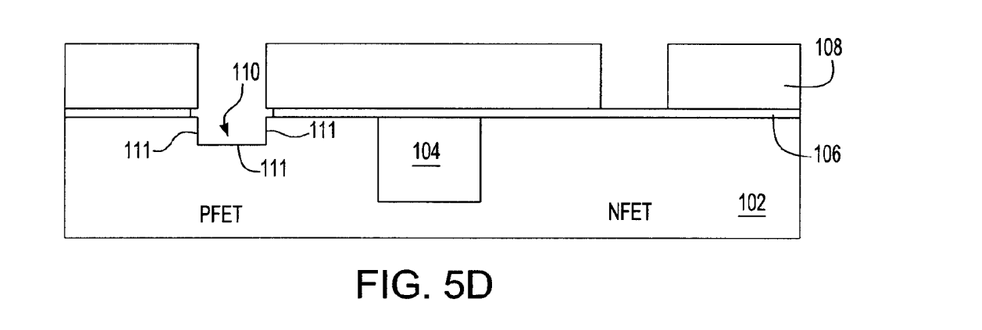

Subsequently, an anisotropic etching step (as described hereinabove) is carried out for selectively etching of the p-FET device region, thereby forming a recess 110 in the semiconductor substrate 102 at the p-FET device region, as shown in FIG. 5D. The recess 110 so formed has a substantially rectangular cross-section and contains interior surfaces 111 that are substantially aligned with the {110} crystal planes. Preferably, but not necessary, the anisotropic etching step involves anisotropic RIE, which uses the previously formed n-FET block mask for selective etching of the p-FET device region.

Figure 5E:
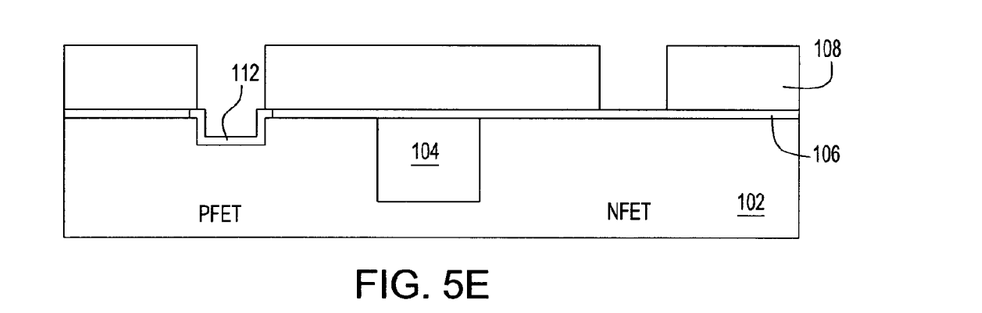

Subsequent to the anisotropic etching, a sacrificial oxide layer 112 is formed by an oxidation process over the interior surfaces 111 of the recess 110, as shown in FIG. 5E. The oxidation process can be either a thermal oxidation process or a chemical oxidation process.

Figure 5F:
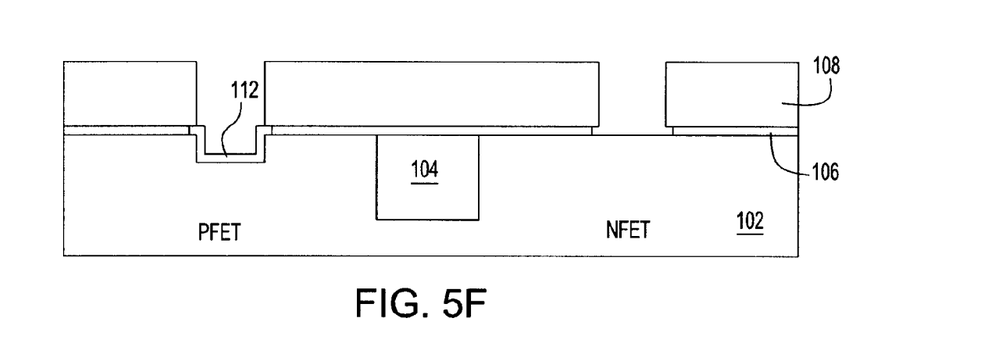

After formation of the sacrificial oxide layer 112, the n-FET block mask is removed from the substrate surface. Another block mask (not shown) is then selectively formed over the p-FET device region, but not the n-FET device region, followed by selective etching of the gate dielectric layer 106 in the n-FET device region, as shown in FIG. 5F. The p-FET block mask is removed after the selective etching of the gate dielectric layer 106.

Figure 5G:
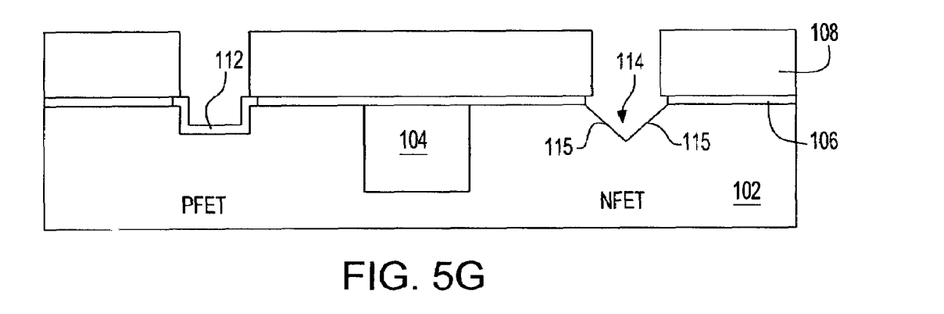

Next, a crystallographic etching step (as described hereinabove) is carried out for selectively etching of the n-FET device region, thereby forming a recess 114 in the semiconductor substrate 102 at the n-FET device region, as shown in FIG. 5G. Preferably, but not necessary, the crystallographic etching step is carried out using a wet-etching process, which employs a hydroxide-based etching solution that etches the {110} planes at a rate much faster than the {100} planes, and during which the sacrificial oxide layer 112 is used a mask to prevent etching at the p-FET device region. Alternatively, if the crystallographic etching step is carried out using a crystallographic RIE process, the p-FET block mask as mentioned hereinabove then should be retained after the selective etching of the gate dielectric layer 106, so that it can be used as a mask during the crystallographic RIE process. The recess 114 so formed therefore has a substantially triangular cross-section and contains interior surfaces 115 that are substantially aligned with the {100} crystal planes, but tilted at a 45° angle with respect to the {110} planes.

Figure 5H:
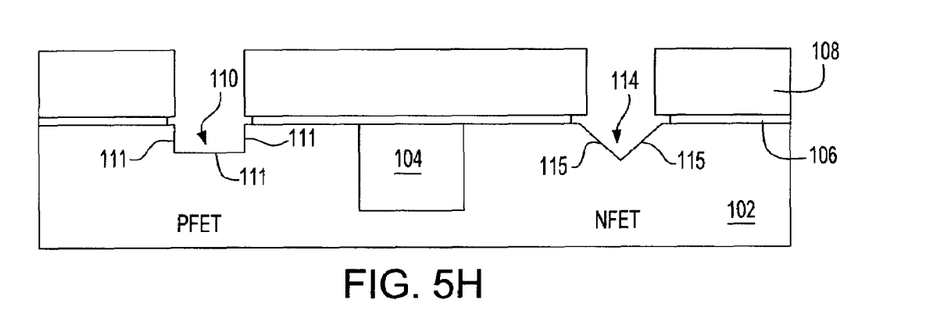
Figure 5I:
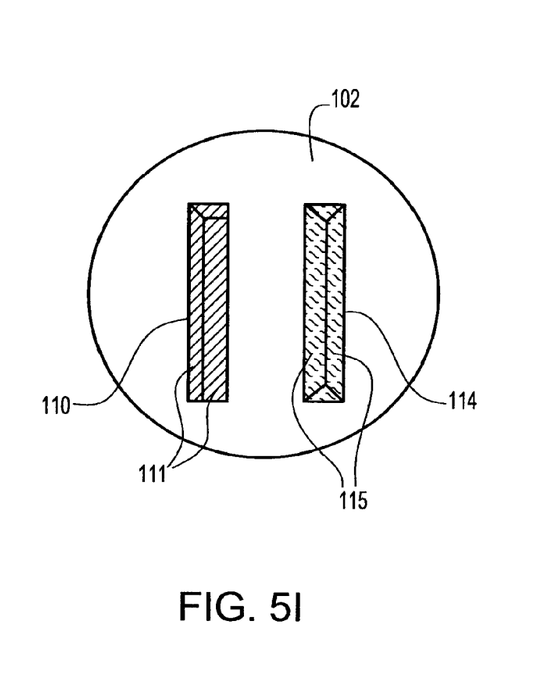

Subsequent to the crystallographic etching, the sacrificial oxide layer 112 is removed from the p-FET device region preferably by an oxide etching process, thereby exposing the interior surfaces 111 and 115 of both recesses 110 and 114, as shown in FIG. 5H. The interior surfaces 111 of the recess 110 are oriented along the {110} planes, while the interior surfaces 115 of the recess 114 are oriented along the {100} planes. FIG. 5I shows a top view of the semiconductor substrate 102 of FIG. 5H, which contains two recesses 110 and 114 with different interior surface orientations.

Figure 5J:
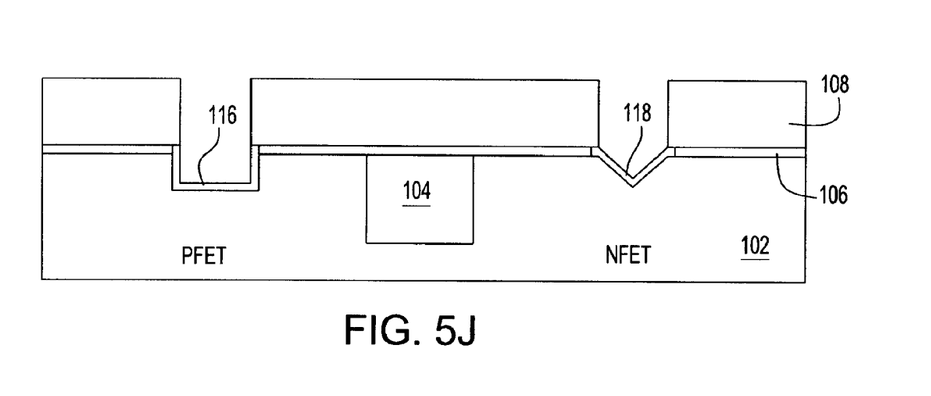
Figure 5K:
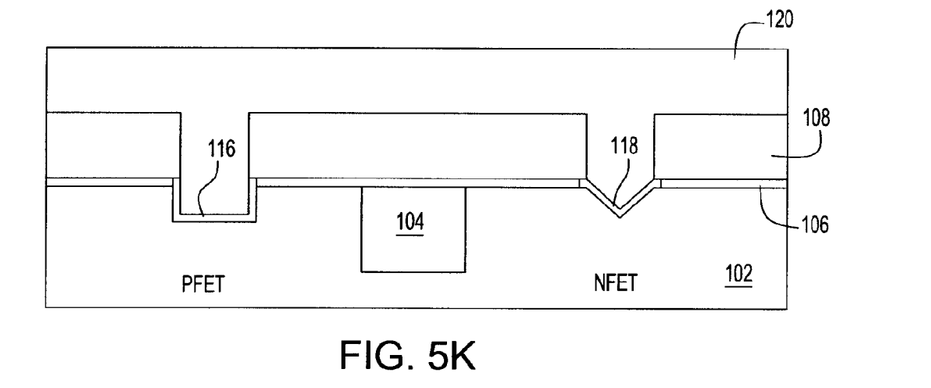
Figure 5L:
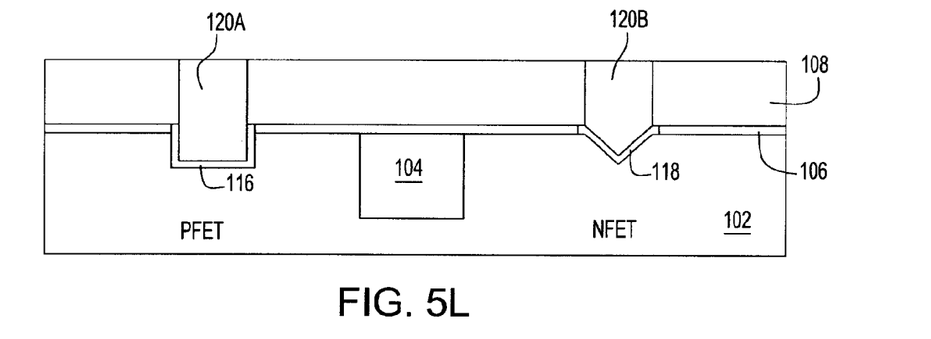

Additional gate dielectric layers 116 and 118 are then formed over the recesses 110 and 114, as shown in FIG. 5J, using a process similar to that described hereinabove for forming the gate dielectric layer 106. Next, a blank gate conductor layer 120 is deposited over the entire structure, as shown in FIG. 5K. The gate conductor layer 120 may comprises any suitable conductive materials, such as metals, metal alloys, metal silicides, metal nitrides, and doped silicon-containing semiconductor materials (such as polysilicon, SiGe, etc.), and it may have a layer thickness ranging from about 50 nm to about 150 nm, and more typically from about 80 nm to about 120 nm. The gate conductor layer 120 is then planarized (e.g., by a chemical mechanical polishing process) to form two gate conductors 120A and 120B, while the upper surfaces of the gate conductors 120A and 120B are coplanar with the upper surface of the dielectric hard mask layer 108, as shown in FIG. 5L. The dielectric hard mask layer 108 is moved subsequently to form exposed gate conductors 120A and 120B, as shown in FIG. 5M.

Figure 5M:
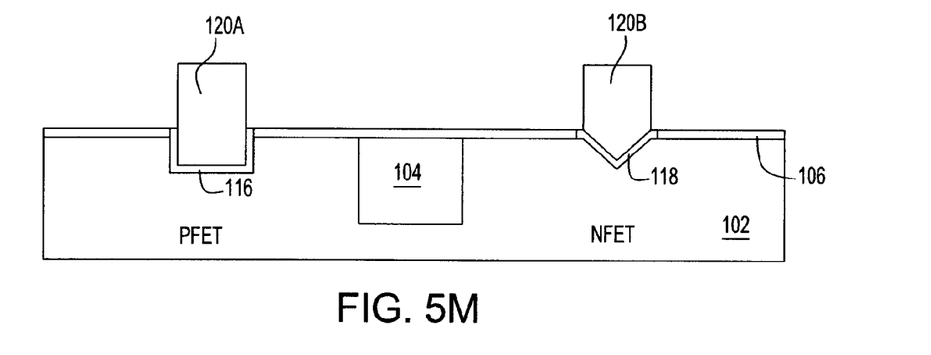

The structure shown in FIG. 5M therefore contains a p-FET gate dielectric layer 116 and a p-FET gate conductor 120A formed over a recess in the p-FET device region, as well as an n-FET gate dielectric layer 118 and an n-FET gate conductor 120B formed over a recess in the n-FET device region. The p-FET gate dielectric layer 116 delineates a p-FET channel that extends along the interior surfaces of the recess in the p-FET device region, and the n-FET gate dielectric layer 118 delineates an n-FET channel that extends along the interior surfaces of the recess in the n-FET device region.

Subsequently, conventional CMOS processing steps, which are not described herein in detail, can be carried out to form a complete CMOS circuit containing a p-FET at the p-FET device region and an n-FET at the n-FET device region, similar to those shown in FIG. 3.

It is noted that the drawings of the present invention are provided for illustrative purposes and are not drawn to scale.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A semiconductor device comprising:
    a semiconductor substrate comprising at least first and second device regions, wherein the first device region comprises a first recess having interior surfaces oriented along a first set of equivalent crystal planes, and wherein the second device region comprises a second recess having interior surfaces oriented along a second, different set of equivalent crystal planes;
    at least one n-channel field effect transistor (n-FET) located at the first device region, said n-FET comprising a channel that extends along the interior surfaces of the first recess; and
    at least one p-channel field effect transistor (p-PET) located at the second device region, said p-PET comprising a channel that extends along the interior surfaces of the second recess.

2. The semiconductor device of claim 1, wherein the semiconductor substrate has a substrate surface that is oriented along one of the first set of equivalent crystal planes.

3. The semiconductor device of claim 1, wherein the semiconductor substrate has a substrate surface that is oriented along one of the second set of equivalent crystal planes.

4. The semiconductor device of claim 1, wherein the semiconductor substrate comprises single crystal silicon, wherein the first set of equivalent crystal planes are the {100} planes of silicon, and wherein the second, different set of equivalent crystal planes are the {110} planes of silicon.

5. The semiconductor device of claim 1, wherein the semiconductor substrate comprises single crystal silicon, wherein the first set of equivalent crystal planes are the {100} planes of silicon, and wherein the second, different set of equivalent crystal planes are the {111} planes of silicon.

6. The semiconductor device of claim 1, wherein the semiconductor substrate comprises single crystal silicon, wherein the first set of equivalent crystal planes are the {111} planes of silicon, and wherein the second, different set of equivalent crystal planes are the {110} planes of silicon.

7. The semiconductor device of claim 1, wherein the n-FET further comprises a source region and a drain region located at opposite sides of the channel and a gate stack located over the channel, and wherein the n-PET has a channel length that is larger than its gate length.

8. The semiconductor device of claim 1, wherein the p-PET further comprises a source region and a drain region located at opposite sides of the channel and a gate stack located over the channel, and wherein the p-PET has a channel length that is larger than its gate length.

* * * * *